United States Patent
Sun et al.

(10) Patent No.: US 12,399,241 B1
(45) Date of Patent: Aug. 26, 2025

(54) HYDROGEN AND FLUORINE DOUBLE RESONANCE RADIOFREQUENCY COIL FOR RECTUM

(71) Applicant: Harbin Medical University, Harbin (CN)

(72) Inventors: Xilin Sun, Harbin (CN); Xinting Bai, Harbin (CN); Kai Wang, Harbin (CN); Chunsheng Yang, Harbin (CN); Weixin Sun, Harbin (CN); Naiyue Tian, Harbin (CN); Chuanxing Wu, Harbin (CN)

(73) Assignee: HARBIN MEDICAL UNIVERSITY, Harbin (CN)

( * ) Notice: Subject to any disclaimer, the term of this patent is extended or adjusted under 35 U.S.C. 154(b) by 0 days.

(21) Appl. No.: 19/006,277

(22) Filed: Dec. 31, 2024

Related U.S. Application Data

(63) Continuation of application No. PCT/CN2024/098543, filed on Jun. 12, 2024.

(30) Foreign Application Priority Data

Feb. 26, 2024 (CN) .......................... 202410209329.2

(51) Int. Cl.
*G01R 33/34* (2006.01)
*G01R 33/422* (2006.01)

(52) U.S. Cl.
CPC ..... *G01R 33/34046* (2013.01); *G01R 33/422* (2013.01)

(58) Field of Classification Search
CPC .......................... G01R 33/422; G01R 33/34046
See application file for complete search history.

(56) References Cited

U.S. PATENT DOCUMENTS

2009/0160442 A1  6/2009  Mazurkewitz et al.

FOREIGN PATENT DOCUMENTS

| | | |
|---|---|---|
| CN | 206675527 U | 11/2017 |
| CN | 109725273 B | 4/2020 |
| CN | 111812568 A | 10/2020 |
| CN | 113504494 A | 10/2021 |
| CN | 114019436 A | 2/2022 |
| CN | 114415090 A | 4/2022 |
| CN | 111812568 B | 12/2022 |
| CN | 117783974 A | 3/2024 |
| JP | 2008089498 A | 4/2008 |
| KR | 20210054222 A | 5/2021 |

*Primary Examiner* — Dixomara Vargas
(74) *Attorney, Agent, or Firm* — Bayramoglu Law Offices LLC

(57) ABSTRACT

A hydrogen-fluorine dual-resonance radiofrequency (RF) coil for a rectum includes a support pillar, where the support pillar is provided with a first conductive tape, a second conductive tape, a third conductive tape, and a fourth conductive tape; at one end of the support pillar, the first conductive tape and the second conductive tape are connected through a resistor $R_1$, and the third conductive tape and the fourth conductive tape are connected through a capacitor $C_1$; the capacitor $C_1$ is provided with an excitation port; the excitation port is connected to a dual tuning and matching circuit; at the other end of the support pillar, the first conductive tape and the third conductive tape are connected through a resistor $R_2$, and the second conductive tape and the fourth conductive tape are connected through a resistor $R_3$; a middle portion of each of the conductive tapes is provided with an opening.

5 Claims, 6 Drawing Sheets

HYDROGEN AND FLUORINE DOUBLE RESONANCE RADIOFREQUENCY COIL FOR RECTUM

CROSS-REFERENCE TO THE RELATED APPLICATIONS

This application is the continuation application of International Application No. PCT/CN2024/098543, filed on Jun. 12, 2024, which is based upon and claims priority to Chinese Patent Application No. 202410209329.2, filed on Feb. 26, 2024, the entire contents of which are incorporated herein by reference.

TECHNICAL FIELD

The present disclosure relates to the technical field of magnetic resonance imaging (MRI), and in particular to a hydrogen-fluorine dual-resonance radiofrequency (RF) coil for a rectum.

BACKGROUND

Accurately assessing the staging of rectal cancer before surgery is crucial, and it mainly relies on medical imaging examinations. As the preferred method for local assessment of rectal cancer recommended by the European Society of Oncology (ESMO), magnetic resonance imaging (MRI) can provide important information for the staging of rectal cancer and plays a crucial role in the diagnosis and treatment of rectal cancer.

In MRI technology, a radiofrequency (RF) transmitting coil emits an RF signal with a specific frequency to the test object in the main magnetic field. The resonant nucleus of the test object undergoes MR after being excited by an RF pulse at this frequency, and the MR signal generated during the process is acquired by an RF receiving coil. By performing Fourier transform on the MR signal received by the RF receiving coil, an MR image is reconstructed.

As a measure of the efficiency of the coil circuit to detect the MR signal, Q value is closely related to the intensity of the MR signal received by the receiving coil. There are many methods to increase Q value (i.e. reduce losses), but the most commonly used one is to increase the resistance of the sample. By placing the coil closer to the sample, the resistance of the sample can be increased, that is, by selecting a coil closer to the region of interest (ROI), a higher-quality image can be acquired. This method covers the imaging region without picking up noise from a further region of the subject. Compared to ordinary surface coils, the rectum coil is smaller in volume and closer to the ROI. Therefore, the rectum coil can display the structure of the rectal cancer lesion more clearly, making it more helpful to clarify the diagnosis and determine staging.

However, the existing MR RF coils for the rectum are mostly ordinary surface coils, with a lower imaging signal-to-noise ratio (SNR) than inserted rectal RF coils. At present, the inserted rectum coils involved in research are mostly single nuclear ($^1$H) coils, which can hardly analyze the information in the living organism from the molecular level to determine the occurrence and development process of the disease.

Patent document CN114415090A discloses a four-channel MR rectum coil. The rectum coil includes multiple layers of circuits stacked on the surface of a support pillar. The multiple layers of circuits require overlapping decoupling, otherwise the coupling between different channels will seriously affect image quality. However, if the size of the structure is reduced, it will result in that the multiple layers of circuits cannot be stacked. Therefore, the rectum coil is suitable for rectums with large inner diameters and not suitable for thin rectums with an inner diameter of only 5-7 mm, such as rabbit rectum.

Patent document CN109725273B discloses an MR dual-mode tuned hydrogen-fluorine deformed birdcage RF coil. With a complex structure and large volume, the birdcage RF coil cannot be used as an in-vivo coil to provide images with a high SNR, but can only be used as an in-vitro coil.

Patent document CN111812568B discloses a hydrogen-fluorine dual-resonance transceiver RF surface coil. The RF coil is a surface coil with low imaging SNR. However, the above literature does not involve the design of an in-vivo coil suitable for 5-7 mm thin rectums and capable of receiving higher-quality MR signals.

SUMMARY

The present disclosure proposes a hydrogen-fluorine dual-resonance radiofrequency (RF) coil for a rectum, which is suitable for a rectum with an inner diameter of 5 mm or more, such as a rectum with an inner diameter of 6 mm, supports $^1$H-$^{19}$F simultaneous imaging in the rectum, and can reconstruct magnetic resonance (MR) images with higher signal-to-noise ratio (SNR) and higher quality.

The present disclosure is implemented by the following technical solution. A hydrogen-fluorine dual-resonance RF coil for a rectum includes a support pillar, where the support pillar is provided with a coil circuit; the coil circuit includes four conductive tapes; the four conductive tapes are evenly spaced along a circumferential direction on a side wall of the support pillar; the four conductive tapes include a first conductive tape, a second conductive tape, a third conductive tape, and a fourth conductive tape in sequence; at one end of the support pillar, the first conductive tape and the second conductive tape are connected through a resistor $R_1$, and the third conductive tape and the fourth conductive tape are connected through a capacitor $C_1$; the capacitor $C_1$ and the resistor $R_1$ are parallel to each other; the capacitor $C_1$ is provided with an excitation port; the excitation port is connected to a dual tuning and matching circuit; at the other end of the support pillar, the first conductive tape and the third conductive tape are connected through a resistor $R_2$, and the second conductive tape and the fourth conductive tape are connected through a resistor $R_3$; the resistor $R_2$ and the resistor $R_3$ have different axial heights and form an orthogonal structure; a middle portion of each of the conductive tapes is provided with an opening; the opening is connected to a capacitor $C_0$; and the capacitor $C_0$ is provided with a differential port.

Furthermore, the dual tuning and matching circuit is connected to the low-noise preamplifier, and the low-noise preamplifier is connected to the backend of the RF receiving system.

Furthermore, the side wall of the support pillar is provided with a recess corresponding to the conductive tape, and the conductive tape is embedded in the recess.

Furthermore, an end of the first conductive tape and an end of the third conductive tape are connected to the resistor $R_2$, have a same height and are both higher than the support pillar; and and an end of the second conductive tape and an end of the fourth conductive tape are connected to the resistor $R_3$, have a same height and are both flush with an end portion of the support pillar.

Furthermore, each of the conductive tapes is provided along an axial direction of the support pillar.

Furthermore, the support pillar is a circular or a circular or prismatic support pillar.

The present disclosure has the following beneficial effects:

In the present disclosure, the hydrogen-fluorine dual-resonance RF coil for a rectum features a simple structure and small volume. It is suitable for a rectum with an inner diameter of 5 mm and above, such as a rectum with an inner diameter of 6 mm, supports $^1H$-$^{19}F$ simultaneous imaging in the rectum, and can reconstruct MR images with higher SNR and higher quality. The axial heights of the resistors $R_2$ and $R_3$ are different, utilizing a small coil space and avoiding coupling between the two different frequency signals of $^1H$ and $^{19}F$.

In the present disclosure, the hydrogen-fluorine dual-resonance RF coil for a rectal is not limited to a rabbit rectum but is applicable to any scenario that requires a coil structure of a circular or prismatic support pillar, especially a small-sized coil. The structure can achieve dual tuning performance comparable to single tuning and has transferability.

The present disclosure supports $^1H$-$^{19}F$ simultaneous imaging in the rectum, solving the technical difficulty that the current MR RF coils for the rectum are mostly ordinary surface coils and the inserted rectum coils are mostly single nuclear ($^1H$) coils. The present disclosure can analyze the information inside the living organism from multiple dimensions at the molecular level to determine the occurrence and development process of the disease, while ensuring better imaging quality.

The traditional method requires two scans to acquire $^1H$ and $^{19}F$ images. In contrast, the present disclosure acquires $^1H$ and $^{19}F$ images simultaneously only through one scan, greatly reducing imaging time, avoiding motion artifacts caused by the movement of the test object during two scans, and achieving accurate registration and fusion of $^1H$ and $^{19}F$ images.

In the present disclosure, the hydrogen-fluorine dual-resonance RF coil for a rectum can be used in conjunction with an exogenous $^{19}F$ probe for drug delivery, in-situ oxygen partial pressure localization ($pO_2$), tumor targeting, and other application analyses.

Figure 1:
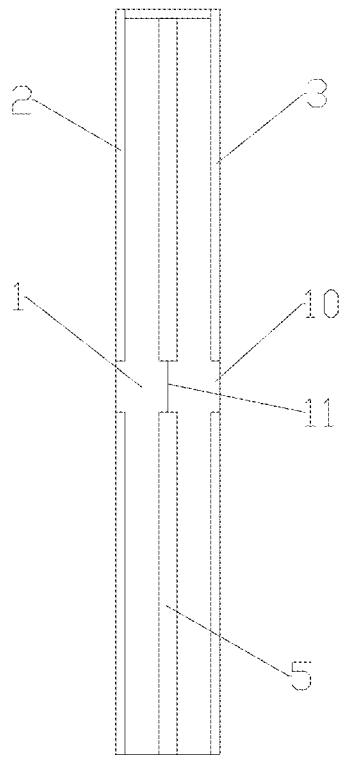
FIG. 1 is a structural diagram of a support pillar.

REFERENCE NUMERALS 1. support pillar; 2. first conductive tape; 3. second conductive tape; 4. third conductive tape; 5. fourth conductive tape; 6. resistor $R_1$; 7. capacitor $C_1$; 8. resistor $R_2$; 9. resistor $R_3$; 10. opening; 11. capacitor $C_0$; 12. excitation port; and 13. dual tuning and matching circuit.

DETAILED DESCRIPTION OF THE EMBODIMENTS

As shown in FIG. 1, a hydrogen-fluorine dual-resonance RF coil for a rectum includes support pillar 1. The support pillar 1 is a solid circular support pillar. The support pillar 1 is made of a flexible material, which effectively avoids wear and tear on a rectal wall when inserted into the rectum during actual examination, effectively improving the examination experience and enhancing examination comfort. The support pillar 1 is provided with a coil circuit. The coil circuit includes four conductive tapes that are made of copper. The four conductive tapes are evenly spaced along a circumferential direction on a side wall of the support pillar 1. Each of the conductive tapes is provided along an axial direction of the support pillar 1. The side wall of the support pillar 1 is provided with a recess corresponding to the conductive tape. The conductive tape is embedded in the recess. The setting of the recess saves coil space. For a small-sized location such as the rectum, it is necessary to minimize coil space as much as possible without affecting performance.

Figure 2:
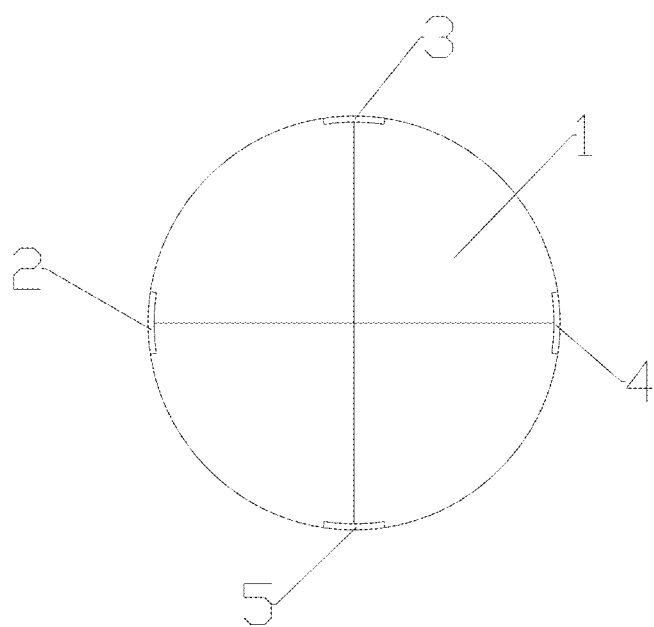
FIG. 2 is a structural diagram of one end of the support pillar.
Figure 3:
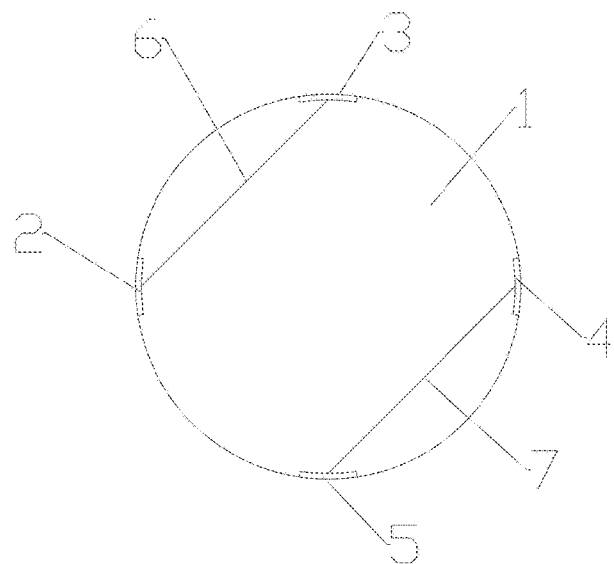
FIG. 3 is a structural diagram of the other end of the support pillar.

As shown in FIGS. 1 to 3, these four conductive tapes include first conductive tape 2, second conductive tape 3, third conductive tape 4, and fourth conductive tape 5 in sequence. At one end of the support pillar 1, the first conductive tape 2 and the second conductive tape 3 are connected through resistor $R_1$ 6, and the third conductive tape 4 and the fourth conductive tape 5 are connected through capacitor $C_1$ 7. The capacitor $C_1$ 7 and the resistor $R_1$ 6 are parallel to each other. At the other end of the support pillar 1, the first conductive tape 2 and the third conductive tape 4 are connected through resistor $R_2$ 8, and the second conductive tape 3 and the fourth conductive tape 5 are connected through resistor $R_3$ 9. The resistor $R_2$ 8 and the resistor $R_3$ 9 form an orthogonal structure. In addition, an end of the first conductive tape 2 and an end of the third conductive tape 4 are connected to the resistor $R_2$ 8, have a same height, and are both higher than the support pillar 1. An end of the second conductive tape 3 and an end of the fourth conductive tape 5 are connected to the resistor $R_3$ 9, have a same height, and are both flush with an end portion of the support pillar 1. Through the structure setting, the axial heights of the resistor $R_2$ 8 and the resistor $R_3$ 9 are different to avoid coupling.

A middle portion of each of the conductive tapes is provided with opening 10. Capacitor $C_0$ 11 is welded at the opening 10, and the capacitor $C_0$ 11 is provided with a differential port.

Figure 4:
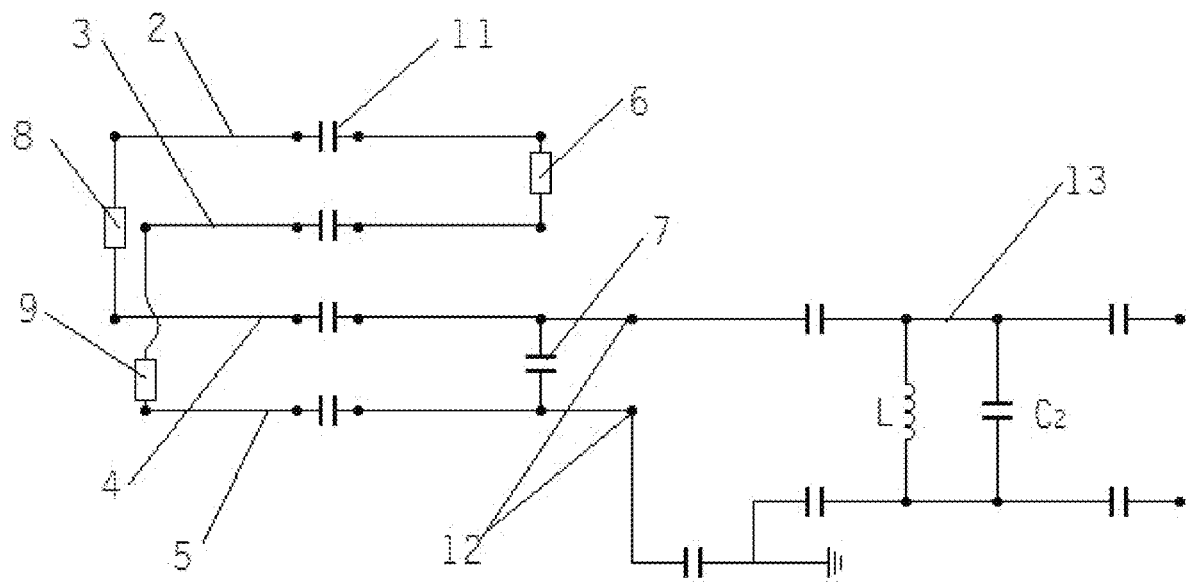
FIG. 4 is a planar circuit diagram of a coil circuit and a dual tuning and matching circuit.

As shown in FIG. 4, excitation port 12 is provided at the capacitor $C_1$ 7. The excitation port 12 is connected to dual tuning and matching circuit 13. The dual tuning and matching circuit 13 is configured to tune and match the coil, causing a resonance at resonant frequencies of $^1H$ and $^{19}F$. Taking a 3T platform as an example, $^1H$ and $^{19}F$ resonate at 128.2 MHz and 120.6 MHz, respectively. Inductor L and capacitor $C_2$ form an LC parallel resonant circuit. When the signal frequency in the coil is too low, the signal mainly passes through the inductor L. At this point, the circuit exhibits an inductance and there is a positive phase angle. When the signal frequency in the coil is too high, the signal mainly passes through the capacitor $C_2$. At this point, the circuit exhibits a capacitance and the phase angle is negative. When the signal is at a specific frequency, the circuit only exhibits a pure resistance, that is, a sine wave oscillation occurs.

Figure 5:
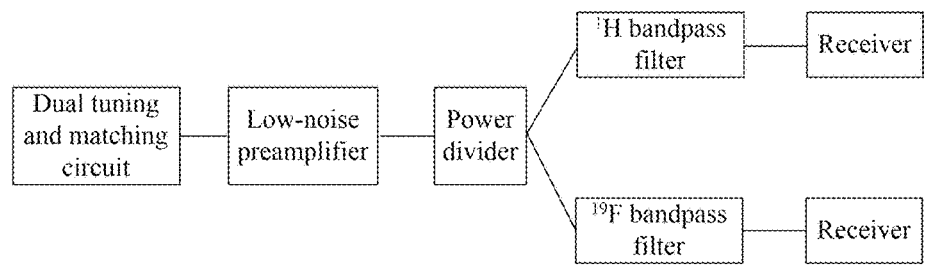
FIG. 5 is a structural diagram of a backend of an RF receiving system.

As shown in FIG. 5, the dual tuning and matching circuit 13 is connected to a low-noise preamplifier. The low-noise preamplifier is connected to a backend of an RF receiving system. The backend of the RF receiving system includes a power divider, a $^1$H bandpass filter, and a $^{19}$F bandpass filter. The power divider divides an RF signal output by the low-noise preamplifier into two signals. The two signals are respectively output to the $^1$H bandpass filter and the $^{19}$F bandpass filter, and are respectively output to corresponding receivers after being filtered.

To verify the imaging performance of the RF coil, the three-dimensional electromagnetic simulation software CST Studio Suite is used to simulate an S-parameter and magnetic field distribution of the RF coil separately. The simulation of the S-parameter is to ensure that the designed coil resonates at the target resonant frequency and that the loss of the MR signal received by the coil at the target resonant frequency is small. The simulation of the magnetic field distribution is to ensure that the designed coil can receive a magnetic field with sufficiently high field intensity.

Figure 8:
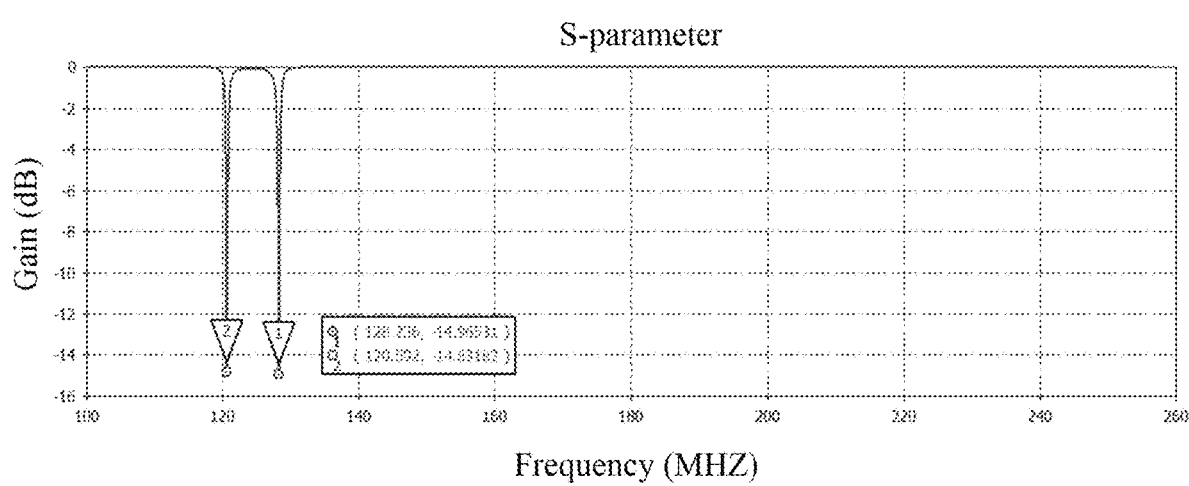
FIG. 8 shows a simulation result of a $^1H$-$^{19}F$ dual-tuning S-parameter of the coil.
Figure 9:
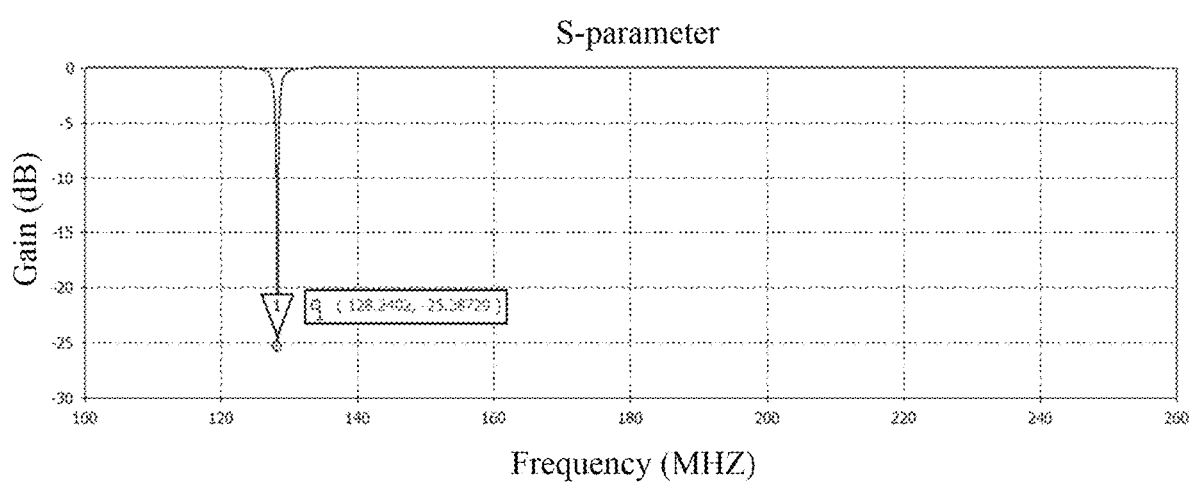
FIG. 9 shows a simulation result of a $^1H$ single-tuning S-parameter of the coil.
Figure 10:
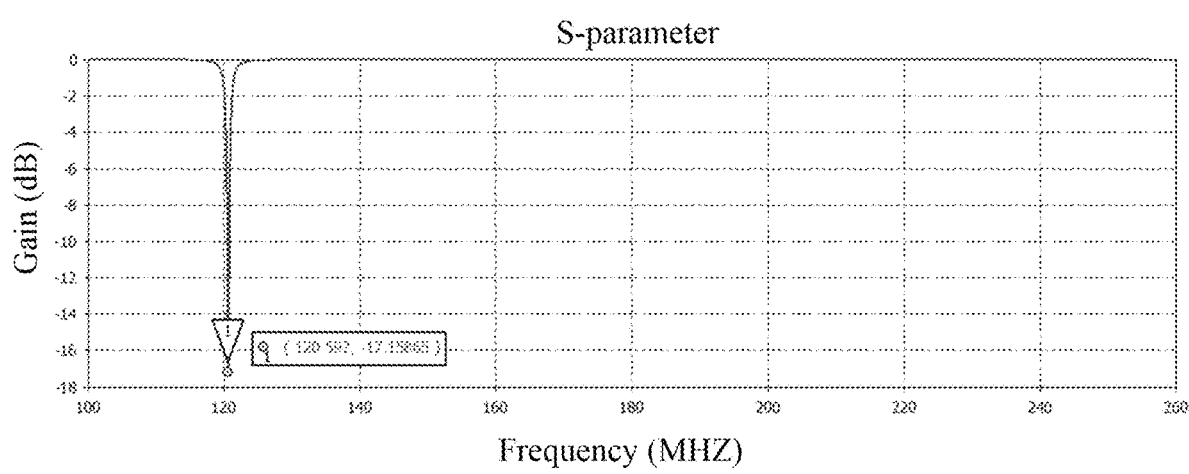
FIG. 10 shows a simulation result of a $^{19}F$ single-tuning S-parameter of the coil.

In the simulation of the S-parameter, taking the 3T platform as an example, $^1$H and $^{19}$F resonate at 128.2 MHz and 120.6 MHz, respectively. In theory, compared with single tuning, in dual tuning, the signal loss of the RF coil will inevitably increase, but simultaneous imaging is achieved only by achieving dual tuning, which is a technical difficulty. As shown in FIGS. 8 to 10, the simulation result of the S-parameter of the RF coil indicates that the RF coil of this embodiment can resonate at 128.2 MHz and 120.6 MHz. The gain of $^1$H-$^{19}$F dual tuning at the target resonant frequency is around −15 dB, the gain of $^1$H single tuning at the target resonant frequency is −25 dB, and the gain of $^{19}$F single tuning at the target resonant frequency is −17 dB. This indicates that the signal loss of the coil at the target resonant frequency is relatively small, and the performance of $^1$H-$^{19}$F dual tuning is similar to that of single tuning. The vast majority of MR signals are transmitted from the transmitting end to the receiving end instead of being reflected along the transmission line, which ensures the acquisition of images with high SNR.

The RF coil ultimately needs to be inserted into the rectum of a living organism for scanning and imaging, and the unique electromagnetic environment inside the living organism will have a certain impact on the magnetic field distribution of the RF coil. In order to simulate the actual insertion of the RF coil into the living organism for imaging more realistically, a hollow cylinder is designed according to the RF coil structure of this embodiment. This hollow cylinder serves as a phantom. The hollow part of the phantom is used for accommodating the RF coil of this embodiment. During simulation, the material properties of the solid part of the phantom are set to conform to the dielectric constant of the living organism, in order to simulate the electromagnetic physiological environment inside the real living organism.

Figure 6:
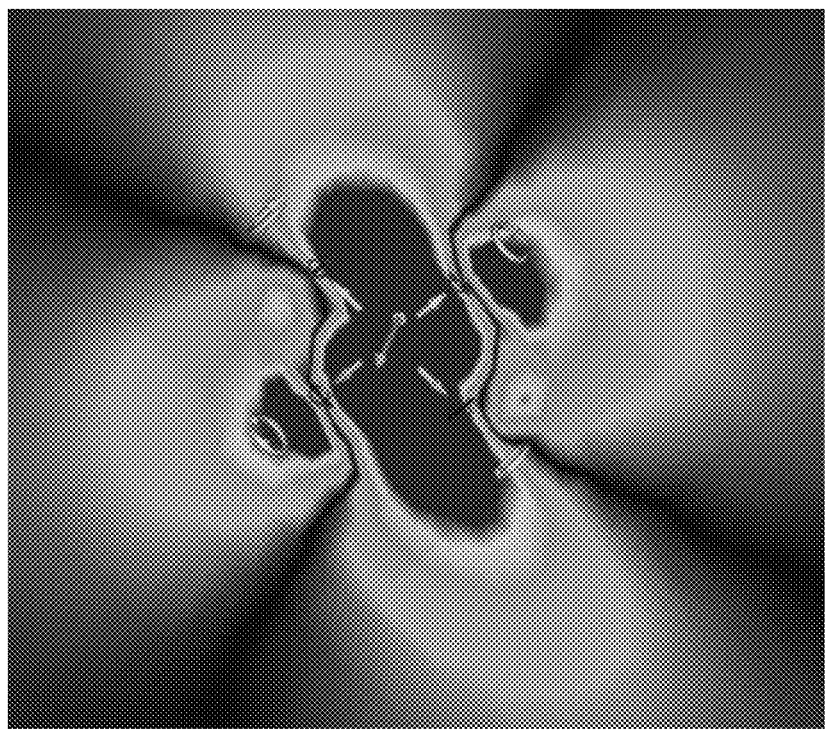
FIG. 6 shows a simulation result of magnetic field distribution of an RF coil in the absence of a phantom.
Figure 7:
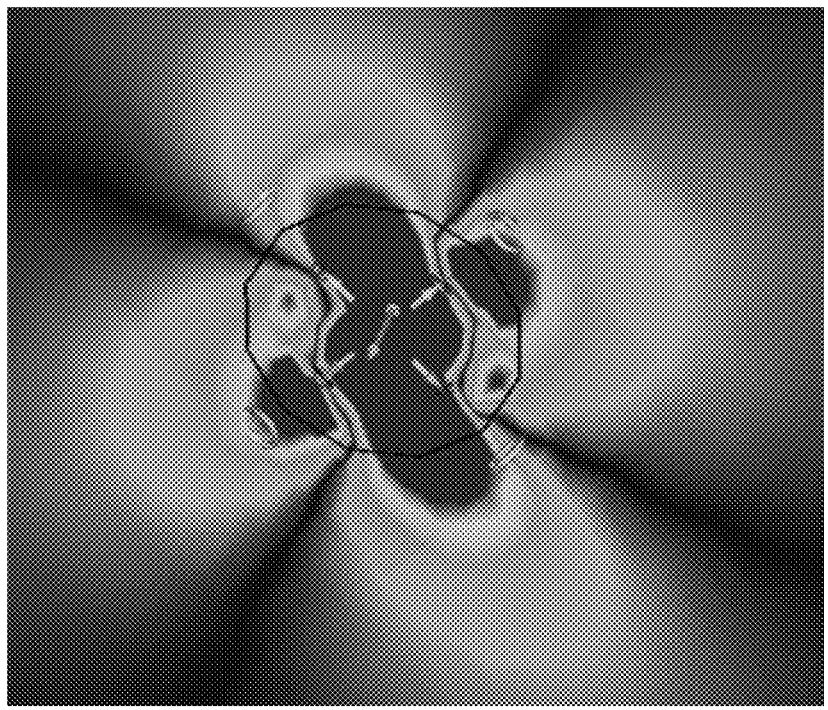
FIG. 7 shows a simulation result of magnetic field distribution of the RF coil in the presence of the phantom.

To simulate the magnetic field distribution of the RF coil, the RF coil itself is first simulated, and the simulation result is shown in FIG. 6. Then, the RF coil and the phantom are simulated together, and the simulation result is shown in FIG. 7. Finally, the two simulation results are compared. From the simulation result of the magnetic field distribution of the RF coil, it can be seen that the simulation result of the coil and the phantom is similar to that of the coil alone, which proves that the RF coil prepared in this embodiment has good performance when actually inserted into the living organism for imaging. From FIGS. 6 and 7, it can be seen that the received field intensity of the RF coil in the coil part and around the coil is sufficiently high, and when actually inserted into the living organism for scanning and imaging, the received field intensity of the RF coil in the coil part and around the coil is also sufficiently high. This indicates that the coil can be used to reconstruct MR images with higher SNR and higher quality.

What is claimed is:

1. A hydrogen-fluorine dual-resonance radiofrequency (RF) coil for a rectum, comprising a support pillar, wherein the support pillar is provided with a coil circuit; the coil circuit comprises four conductive tapes; the four conductive tapes are evenly spaced along a circumferential direction on a side wall of the support pillar; the four conductive tapes comprise a first conductive tape, a second conductive tape, a third conductive tape, and a fourth conductive tape in sequence; at a first end of the support pillar, the first conductive tape and the second conductive tape are connected through a resistor $R_1$, and the third conductive tape and the fourth conductive tape are connected through a capacitor $C_1$; the capacitor $C_1$ and the resistor $R_1$ are parallel to each other; the capacitor $C_1$ is provided with an excitation port; the excitation port is connected to a dual tuning and matching circuit; at a second end of the support pillar, the first conductive tape and the third conductive tape are connected through a resistor $R_2$, and the second conductive tape and the fourth conductive tape are connected through a resistor $R_3$; the resistor $R_2$ and the resistor $R_3$ have different axial heights and form an orthogonal structure; a middle portion of each of the four conductive tapes is provided with an opening; the opening is connected to a capacitor $C_0$; and the capacitor $C_0$ is provided with a differential port;

an end of the first conductive tape and an end of the third conductive tape are connected to the resistor $R_2$, have a same height and are both higher than the support pillar; and an end of the second conductive tape and an end of the fourth conductive tape are connected to the resistor $R_3$, have a same height and are both flush with an end portion of the support pillar; and the dual tuning and matching circuit is connected to a low-noise preamplifier; the low-noise preamplifier is connected to a backend of an RF receiving system; the backend of the RF receiving system comprises a power divider, a $^1$H bandpass filter, and a $^{19}$F bandpass filter; the power divider is configured to divide an RF signal output by the low-noise preamplifier into two signals; and the two signals are respectively output to the $^1$H bandpass filter and the $^{19}$F bandpass filter, and are respectively output to corresponding receivers after being filtered.

2. The hydrogen-fluorine dual-resonance RF coil for the rectum according to claim 1, wherein the dual tuning and matching circuit is connected to the low-noise preamplifier, and the low-noise preamplifier is connected to the backend of the RF receiving system.

3. The hydrogen-fluorine dual-resonance RF coil for the rectum according to claim 1, wherein the side wall of the support pillar is provided with a recess corresponding to each of the four conductive tapes, and each of the four conductive tapes is embedded in the recess.

4. The hydrogen-fluorine dual-resonance RF coil for the rectum according to claim 1, wherein each of the four conductive tapes is provided along an axial direction of the support pillar.

5. The hydrogen-fluorine dual-resonance RF coil for the rectum according to claim 1, wherein the support pillar is a circular or prismatic support pillar.

\* \* \* \* \*